United States Patent
Yasuda et al.

(10) Patent No.: US 9,931,730 B2
(45) Date of Patent: Apr. 3, 2018

(54) AUTOMATIC HANDLING APPARATUS WITH POSITIONING PINS

(71) Applicant: SHIN-ETSU HANDOTAI CO., LTD., Tokyo (JP)

(72) Inventors: Taichi Yasuda, Kita-ku (JP); Tatsuo Enomoto, Setagaya-ku (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 15/314,982

(22) PCT Filed: May 13, 2015

(86) PCT No.: PCT/JP2015/002425
§ 371 (c)(1),
(2) Date: Nov. 30, 2016

(87) PCT Pub. No.: WO2015/194092
PCT Pub. Date: Dec. 23, 2015

(65) Prior Publication Data
US 2017/0190019 A1   Jul. 6, 2017

(30) Foreign Application Priority Data

Jun. 16, 2014 (JP) .................................. 2014-123518

(51) Int. Cl.
*H01L 21/683* (2006.01)
*B24B 37/27* (2012.01)
(Continued)

(52) U.S. Cl.
CPC .............. *B24B 37/27* (2013.01); *B25J 9/042* (2013.01); *B25J 9/102* (2013.01); *B25J 15/0616* (2013.01);
(Continued)

(58) Field of Classification Search
CPC ....... H01L 21/6838; B25J 9/042; B25J 9/102; B25J 15/0616
See application file for complete search history.

(56) References Cited

U.S. PATENT DOCUMENTS

| | | | | |
|---|---|---|---|---|
| 5,174,067 A | * | 12/1992 | Hasegawa | H01L 21/67023 414/217 |
| 6,113,490 A | * | 9/2000 | Hakomori | B24B 37/08 257/E21.23 |
| 2012/0220200 A1 | * | 8/2012 | Fukushima | H01L 21/6838 451/60 |

FOREIGN PATENT DOCUMENTS

| | | |
|---|---|---|
| JP | S58-217268 A | 12/1983 |
| JP | S61-241060 A | 10/1986 |

(Continued)

OTHER PUBLICATIONS

Aug. 4, 2015 International Search Report issued in Japanese Patent Application No. PCT/JP2015/002425.
(Continued)

Primary Examiner — Gerald McClain
(74) Attorney, Agent, or Firm — Oliff PLC (57) ABSTRACT

Automatic handling apparatus having a suction-head sucking and holding a workpiece, an arm is connected to and moves the suction-head, and a stage on which the workpiece to be carried to the carrier holding hole is mounted, the suction-head has a movable section which is movable within a parallel plane to the suction-head body, the movable section to suck and hold the workpiece, and has positioning pins stretched in vertically lower direction and, at loading time, the workpiece held by the movable section into the carrier holding hole, the positioning pins are appressed against tooth-bottoms of a gear on the carrier outer periphery and movable section moving within the parallel plane. The carrier is pushed against the sun gear side to fix the carrier (Continued)

position and direction, and the held workpiece is carried into the holding hole. Consequently, the automatic handling apparatus load the workpiece into the carrier holding hole.

3 Claims, 5 Drawing Sheets

(51) Int. Cl.
    *H01L 21/68* (2006.01)
    *H01L 21/02* (2006.01)
    *B25J 15/06* (2006.01)
    *B25J 9/04* (2006.01)
    *B25J 9/10* (2006.01)

(52) U.S. Cl.
    CPC .............. *H01L 21/02* (2013.01); *H01L 21/68* (2013.01); *H01L 21/6838* (2013.01)

(56) References Cited

FOREIGN PATENT DOCUMENTS

| | | | | |
|---|---|---|---|---|
| JP | 63068359 A | * | 3/1988 | |
| JP | S63-068359 A | | 3/1988 | |
| JP | 2000-042913 A | | 2/2000 | |
| JP | 2005-243996 A | | 9/2005 | |
| JP | 2008-110477 A | | 5/2008 | |
| JP | 2013215813 A | * | 10/2013 | ............. B24B 37/08 |
| SG | 193771 A1 | | 10/2013 | |
| TW | 201402271 A | | 1/2014 | |

OTHER PUBLICATIONS

Feb. 10, 2017 Office Action issued in Taiwanese Patent Application No. 104116735.
Feb. 10, 2017 Search report issued in Taiwanese Patent Application No. 104116735.

* cited by examiner

AUTOMATIC HANDLING APPARATUS WITH POSITIONING PINS

TECHNICAL FIELD

The present invention relates to an automatic handling apparatus which automatically carries a workpiece such as a silicon wafer.

BACKGROUND ART

In conventional examples, when both upper and lower surfaces of a sheet-like workpiece such as a silicon wafer are flattened at the same time, a double-side machining apparatus such as a double-side polishing apparatus or a double-side lapping apparatus is used. For example, in the double-side polishing apparatus, a discoid planetary gear called a carrier is arranged between upper and lower turntables each having a polishing pad made of urethane foam or non-woven fabric attached thereto. The workpiece is inserted into and held in a holding hole of this carrier, and the carrier rotates or revolves by mutually rotating a sun gear and an internal gear which engage with the carrier. The upper and lower surfaces of workpiece are simultaneously polished by the rotation, the revolution, the rotation of the upper and lower turntables, and sliding on the workpiece. Further, to efficiently perform polishing, polishing slurry is supplied from a plurality of holes provided in the upper turntable during the double-side polishing.

Furthermore, the upper turntable includes a mechanism which moves up and down, the upper turntable is set at an upper position, and then the carrier is set on the lower turntable, or the workpiece is set in the set carrier. As to the setting of the workpiece into the carrier, there are a case where an operator manually performs loading into a workpiece holding hole of the carrier and a case where an automatic handling apparatus is used for loading. After the workpiece is loaded in this manner, the upper turntable moves down, and the workpiece and the carrier are sandwiched between the upper and lower turntables. Moreover, the workpiece is polished by the rotation and the revolution of the carrier which are realized by the rotation of the upper and lower turntables and the rotation of the internal gear and the sun gear while supplying the polishing slurry.

CITATION LIST

Patent Literature

Patent Document 1: Japanese Unexamined Patent publication (Kokai) No. 2005-243996

SUMMARY OF INVENTION

Technical Problem

For example, in a machining process of a silicon wafer, loading or unloading of the silicon wafer into or from a machining process apparatus has been generally shifted from processing by an operator to automatic processing using a robot or the like, and a reduction in labor costs realized by this shift contributes to a decrease in manufacturing costs of the silicon wafer.

However, the double-side polishing apparatus or a double-side lapping apparatus having a mechanism very similar to that of the former apparatus, a technical difficulty level of automatic workpiece unloading is relatively low, but automatic workpiece loading requires an advanced technology. A reason for that will now be described in detail hereinafter.

In case of loading or unloading a workpiece into or from the workpiece holding hole of the carrier in the automatic handling apparatus, a wafer hand is moved to a previously stored position by an articulated robot, a SCARA robot, a turning arm, or any other actuator, and the workpiece is placed or grasped. This carrying mechanism can be generally controlled with a positional accuracy of hundreds of microns or less, and can sufficiently cope with an application to workpiece loading and unloading operations.

On the other hand, it is difficult to increase an accuracy of a position of the workpiece holding hole of the carrier at the time of placing or grasping the workpiece. The position of this workpiece holding hole is inaccurate because fixing a position and a direction of the carrier placed on the lower turntable is difficult.

Meanwhile, in a general double-side polishing apparatus or double-side lapping apparatus, one carrier can hold one or more workpieces, and it is often the case that a plurality of carriers, e.g., five carriers are provided in the apparatus at equal intervals, i.e., intervals of 72°.

At the time of holding the workpieces in the carriers, a target carrier in the plurality of carriers is moved to a specific workpiece loading position by rotating the internal gear and the sun gear. The workpiece is held into the carrier arranged at this specific loading position. After end of holding the workpiece in the carrier placed at this specific loading position, an immediately next carrier is moved to the workpiece loading position by rotating the internal gear and the sun gear 720 in the same direction (this operation is referred to as indexing of a carrier in some situations). The workpieces are held in all the five carriers by repeating the workpiece holding and the indexing for five times.

Figure 10:
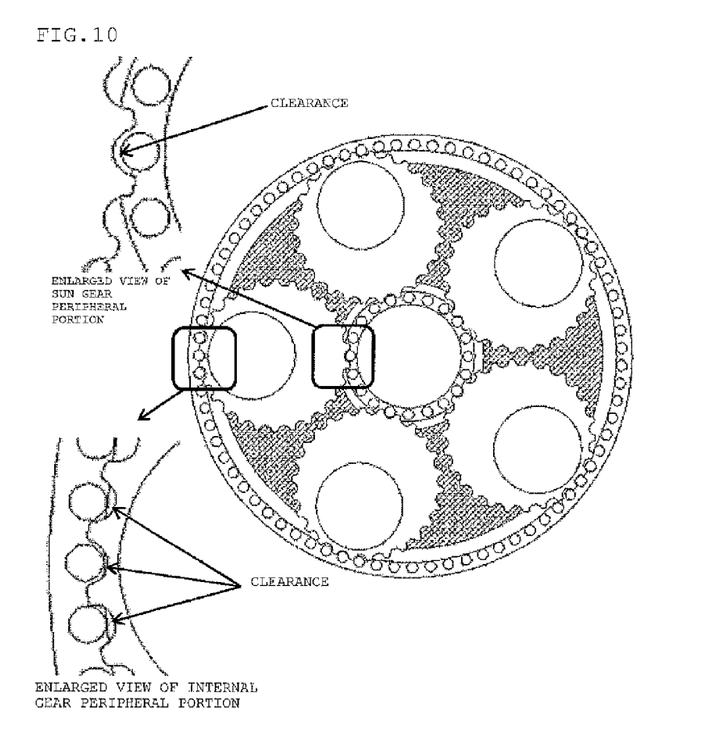
FIG. 10 is a view for explaining clearances between both a sun gear and an internal gear and carriers in a double-side machining apparatus.

As described above, although the position of each carrier is stopped at a desired position by controlling the internal gear and the sun gear, but these gears usually have backlashes, and uncertainty arises in a stop position according to magnitudes of the backlashes. Additionally, although the carriers are engaged with the sun gear and the internal gear and set in the apparatus, it is general to provide clearances between the carriers and both the gears as shown in FIG. 10, which is also a factor that decrease an accuracy of the stop positions of the carriers.

In the unloading of the workpiece, for example, when a silicon wafer is taken as an example, since a wafer having a diameter of 200 mm or a diameter of 300 mm is the main stream nowadays, a reduction in positional accuracy of the order of millimeter due to the backlashes and the clearances between the carriers and the gears when the wafer hand tries grasping the wafer is sufficiently small for a workpiece size, and hence it is often the case the decrease does not lead to a problem.

However, as to the loading of the workpiece, since a diameter of the workpiece holding hole in each carrier is usually approximately 1 mm larger than a diameter of the workpiece at most or it is designed to be smaller than this, the workpiece cannot be repeatedly accurately loaded into the workpiece hole unless unstableness of the carrier positional accuracy is not eliminated.

As regards such a problem, for example, in Patent Literature 1, an apparatus which optically measures a position of each carrier and a position of a workpiece holding hole and loads a workpiece into a position corresponding to the measurement result has been devised. However, introduction of an optical device, calculation of a position of the workpiece holding hole from image information, and software needed for control over a workpiece loading position corresponding to the calculation require considerable costs.

In view of the problem, it is an object of the present invention to provide an automatic handling apparatus which can inexpensively and accurately load a workpiece into a workpiece holding hole in a carrier.

Solution to Problem

To achieve the object, according to the present invention, there is provided an automatic handling apparatus which carries a workpiece into a workpiece holding hole of a carrier for holding the workpiece or carries the workpiece out of the workpiece holding hole of the carrier in a workpiece double-side machining apparatus having the carrier which engages with a sun gear and an internal gear and performs a planetary gear motion, comprising:

a suction head which sucks and holds the workpiece; an arm which is connected to the suction head and moves the suction head; and a stage on which the workpiece to be carried to the workpiece holding hole of the carrier is mounted, wherein the suction head comprises a movable section which is movable within a parallel plane to a main body of the suction head, the movable section is configured to suck and hold the workpiece, and comprises a plurality of positioning pins stretched in a vertically lower direction, and at the time of loading the workpiece held by the movable section into the workpiece holding hole of the carrier, the plurality of positioning pins are appressed against tooth bottoms of a gear on an outer periphery of the carrier and the movable section moves within the parallel plane, thereby the carrier is pushed against the sun gear side to fix a position and a direction of the carrier, and the held workpiece is carried into the carrier holding hole.

In the automatic handling apparatus according to the present invention, the carrier is pushed against the sun gear side by the plurality of positioning pins, the carrier is always fixed at a predetermined position and in a predetermined direction, and then the workpiece is loaded into the workpiece holding hole, and hence the workpiece can be always loaded at the fixed position of the workpiece holding hole. Further, this automatic handling apparatus does not have a special complicated configuration, and does not require an expensive optical device and others. Thus, the workpiece can be accurately loaded into the carrier holding hole without introducing an expensive device such as an optical device or an image processing apparatus, and highly accurate carriage of the workpiece can be realized at low costs.

At this time, it is preferable for the stage to comprise a mechanism configured to mount the workpiece at a position where a center of the workpiece held by the movable section coincides with a center of the workpiece holding hole of the carrier at the time of fixing the position and the direction of the carrier by the plurality of positioning pins.

As described above, when the mechanism which enables the center of the workpiece held by the movable section on the stage in advance to coincide with the center of the workpiece holding hole is provided, further highly accurate carriage of the workpiece can be realized.

Furthermore, at this time, the stage comprises a plurality of positioning holes into which the plurality of positioning pins are inserted when the movable section sucks and holds the workpiece mounted on the stage, and a position of plurality of positioning holes is adjusted so that the movable section is allowed to hold the workpiece at a position where the center of the workpiece held by the movable section coincides with the center of the workpiece holding hole at the time fixing the position and the direction of the carrier by the plurality of positioning pins inserted into the plurality of positioning holes.

Since the suction head in the automatic handling apparatus according to the present invention has the positioning pins in the movable section thereof, inserting such positioning pins into the positioning holes enables holding the workpiece at such a position that the center of the workpiece held by the movable section can coincide with the center of the workpiece holding hole by the simpler configuration, and accurate carriage of the workpiece can be further easily performed.

Advantageous Effects of Invention

According to the automatic handling apparatus of the present invention, an expensive optical device or image processing apparatus is not necessarily required, and the workpiece can be accurately loaded into the workpiece holding hole.

DESCRIPTION OF EMBODIMENTS

Although an embodiment of the present invention will now be described hereinafter, the present invention is not restricted thereto.

As described above, at the time of loading a workpiece into a workpiece holding hole of a carrier in a double-side machining apparatus such as a double-side polishing apparatus or a double-side lapping apparatus, a position or a direction of the carrier is not fixed due to clearances between both a sun gear and an internal gear and the carrier, and hence there is a problem that the workpiece cannot be accurately loaded. Further, although an apparatus which optically measures a position of the carrier and a position of the workpiece holding hole and loads the workpiece into a position corresponding to the measurement results has been devised, there is a problem that an optical device and others require a large amount of introduction costs.

Thus, the present inventors have repeatedly conducted intensive studies to solve the problems. Consequently, they have arrived at that the automatic handling apparatus which can fix a position and a direction of the carrier with the use of positioning pins at the time of loading the workpiece can highly accurately carry the workpiece at low costs with a simple configuration, thereby bringing the present invention to completion.

The automatic handling apparatus according to the present invention will now be described hereinafter with reference to the drawings.

Figure 1:
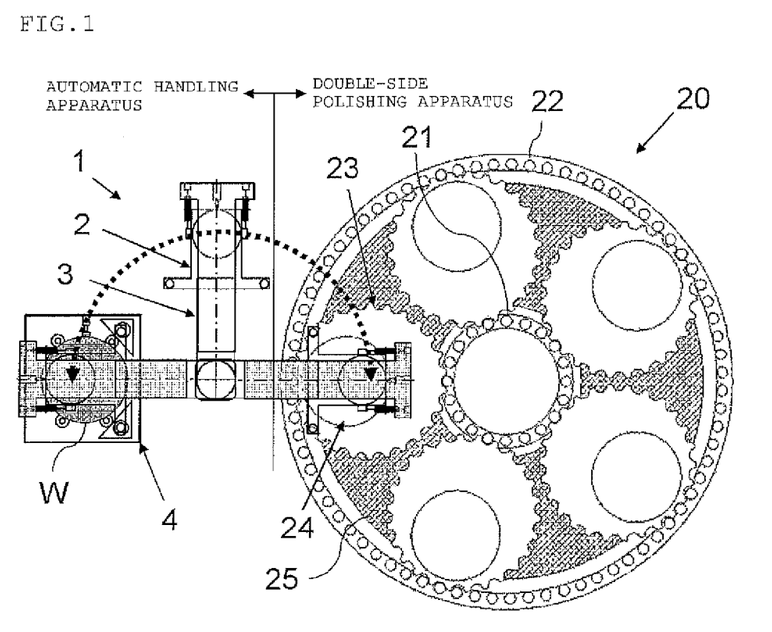
FIG. 1 is a schematic view showing an example of an automatic handling apparatus according to the present invention in a double-side machining apparatus.

As shown in FIG. 1, an automatic handling apparatus 1 according to the present invention carries a workpiece W into a workpiece holding hole 24 of a carrier 23 or carries the same out of the workpiece holding hole 24 in a double-side machining apparatus 20 (FIG. 1 shows a double-side polishing apparatus) having the workpiece holding carriers 23 which engage with a sun gear 21 and an internal gear 22 to perform a planetary gear motion on a lower turntable 25.

This automatic handling apparatus 1 includes a suction head 2 which sucks and holds the workpiece W, an arm 3 which is connected to the suction head 2 and moves the suction head 2, and a stage 4 on which the workpiece W carried to the workpiece holding hole 24 of each carrier 23 in the double-side machining apparatus 20 is mounted. It is to be noted that the machined workpiece W unloaded from the workpiece holding hole 24 can be mounted on the stage 4. Furthermore, although FIG. 1 shows the double-side machining apparatus 20 in which the number of the carriers is five, the number of the carriers is not restricted to five as a matter of course.

In such an automatic handling apparatus 1, the workpiece W mounted on the workpiece 4 is basically sucked and held by the suction head 2. Moreover, the suction head 2 is moved to the upper side of the carrier 23 by the arm 3 so that the workpiece W is placed above the workpiece holding hole 24, then the suction and the holding performed by the suction head 2 are canceled, and the workpiece W is loaded into the workpiece holding hole 24.

Here, as shown in FIGS. 5(a) and (b), the suction head 2 of the automatic handling apparatus 1 according to the present invention has a movable section 5 which can move within a parallel plane to a main body 8 of the suction head, and the movable section 5 can suck and hold the workpiece W and has a plurality of positioning pins 6 which are stretched in a vertically lower direction.

Figure 2:
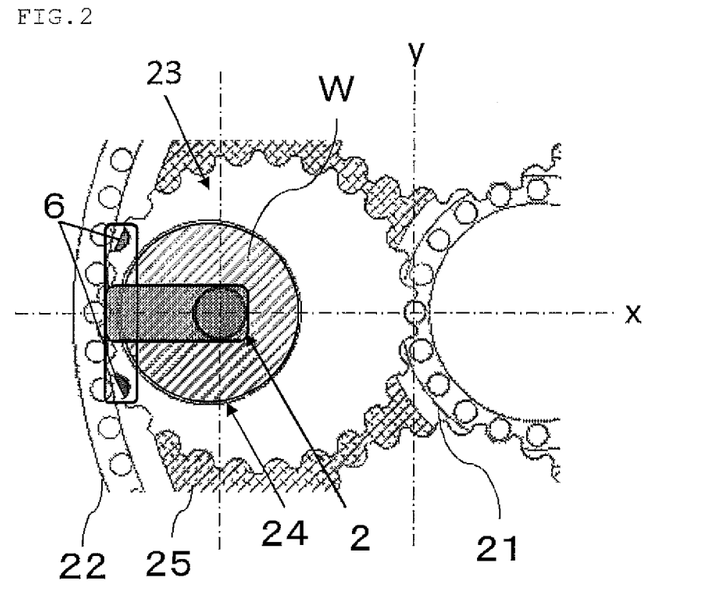
FIG. 2 is a schematic view showing an example of a mode of the automatic handling apparatus according to the present invention when positioning pins are appressed against tooth bottoms of a carrier in the double-side machining apparatus.

Additionally, as shown in FIG. 2, before this suction head 2 loads the workpiece W into the workpiece holding hole 24, the plurality of positioning pins 6 are inserted into spaces surrounded with the carrier 23, the internal gear 22, and the lower turntable 25. Further, at the time of loading the workpiece W into the workpiece holding hole 24, the plurality of positioning pins 6 can push the carrier 23 against the sun gear 21 side. This operation of pushing the carrier 23 against the sun gear 21 side can substantially eliminate a gap between the sun gear 21 and the carrier 23 (namely, a position of the carrier in an x direction in FIG. 2 (a central direction of the lower turntable 25) is determined).

Figure 3:
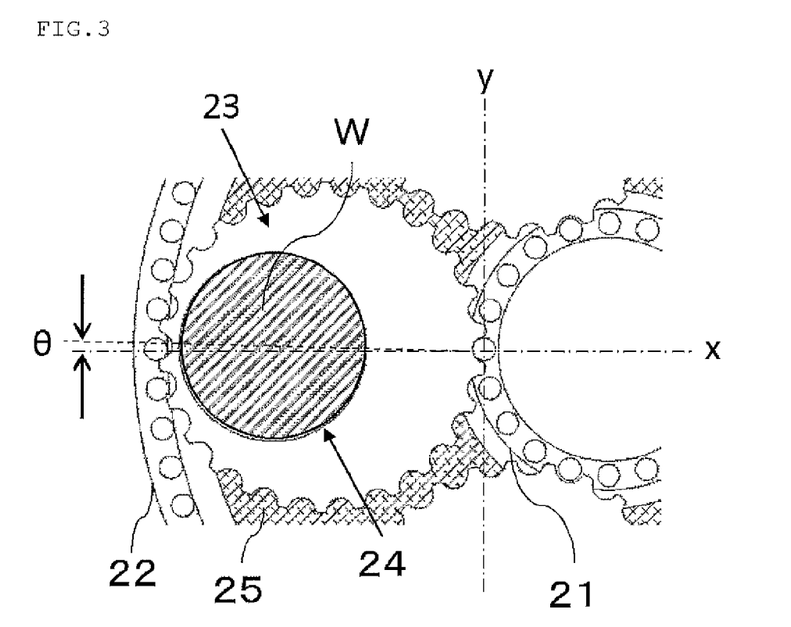
FIG. 3 is a view for explaining an inclination of the carrier in a θ direction in the double-side machining apparatus.

However, when the carrier 23 is simply pushed in the x direction shown in FIG. 2, a direction of the carrier 23 is not determined in a range of a clearance on the internal gear 22 side as shown in FIG. 3. That is, a position in a θ direction (an outer peripheral direction of the lower turntable 25) shown in FIG. 3 cannot be determined.

Figure 4:
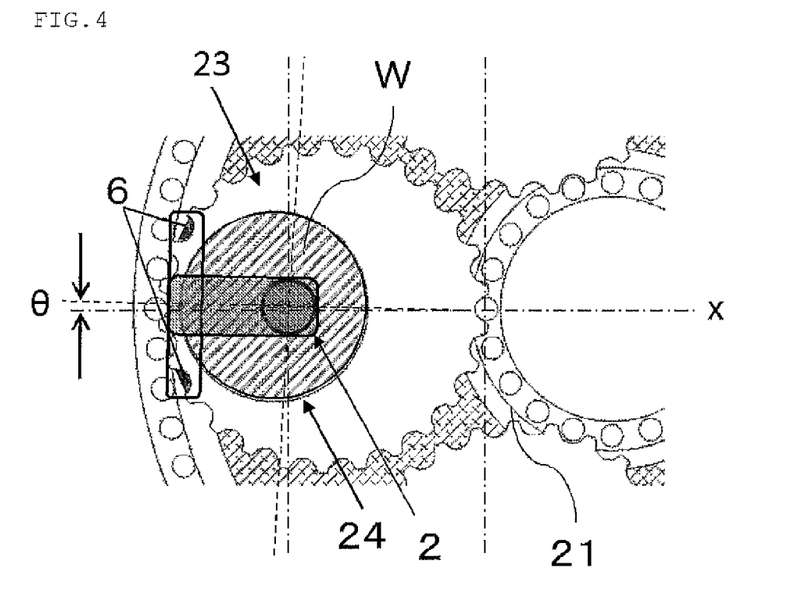
FIG. 4 is a schematic view showing an example of a mode of the automatic handling apparatus according to the present invention when a movable section of a suction head moves and all positioning pins are appressed against the tooth bottoms of the carrier in the double-side machining apparatus.

On the other hand, in the automatic handling apparatus according to the present invention, as shown in FIG. 4, when the carrier 23 is pushed against the sun gear 21 side by the suction head 2, the movable section 5 moves within the parallel plane to the main body of the suction head 2, and the movable section 5 of the suction head 2 can move to be inclined at θ in correspondence with a direction θ of the carrier 23 so that all the positioning pins 6 are appressed against the same positions on the carrier 23, or specifically all the positioning pins 6 are appressed against tooth bottoms of the carrier 23.

With this mechanism, since all the positioning pins 6 are always appressed against the same positions on the carrier 23 and the positioning pins 6 are fixed to the movable section 5, a relationship in position and direction between the movable section 5 which sucks the workpiece and the carrier 23 can always remain the same.

According to the automatic handling apparatus of the present invention including such a suction head 2, even if a stop position accuracy of the carrier is insufficient, a relationship in position and direction between the movable section 5 which sucks the workpiece and the carrier 23 is always the same, and hence the workpiece can be accurately loaded. Further, this automatic handling apparatus does not require measurement of a position of the workpiece holding hole using an expensive optical device or the like. Thus, the workpiece can be accurately loaded into the carrier holding hole without introducing the optical device or the like, and highly accurate loading of the workpiece can be realized at low costs.

An example of configurations of the suction head and the arm in the automatic handling apparatus according to the present invention will now be specifically described hereinafter.

As shown in FIGS. 5(a) and (b), the suction head 2 is disposed to the turnable arm 3, and a stretching/contracting function using a first air cylinder 7 is added to this arm 3. The workpiece W is unloaded from the workpiece holding hole 24 in a state where the arm 3 is contracted, and the workpiece W is loaded in a state where the arm 3 is stretched.

Figure 5:
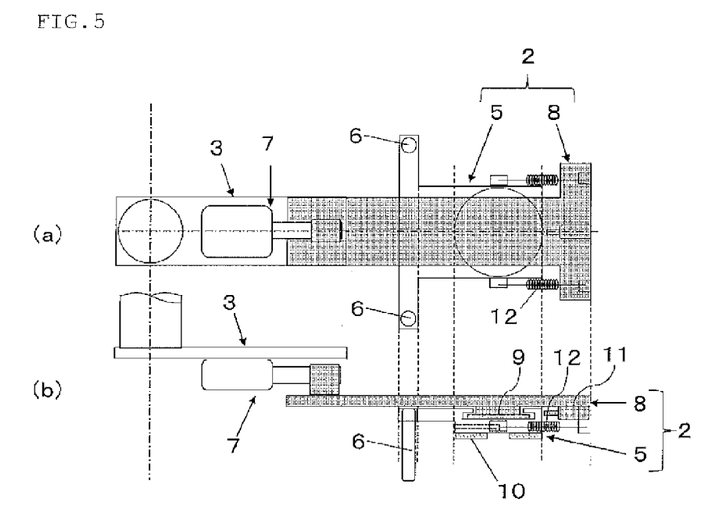
FIGS. 5(a) and 5(b) are a top view and a side elevation showing an example of a configuration of an arm and the suction head in the automatic handling apparatus according to the present invention, respectively.

As shown in FIGS. 5(a) and (b), the suction head 2 has a two-layer structure including an upper portion (a main body 8 of the suction head) fixed to the arm 3 and a lower portion (the movable section 5) connected to the main body 8 of the suction head through a slide bearing 9, and the movable section 5 can move within the parallel plane to the main body 8. In this case, a section which actually sucks and holds the workpiece W is the movable section 5, a suction pad 10 is attached to a lower surface of the movable section 5, and the workpiece W is vacuum-sucked and held by this suction pad 10. Further, this movable section 5 has a plate fixed to the movable section 5, and the plurality of positioning pins stretched in the vertically lower direction are disposed to this plate. It is to be noted that FIG. 5 shows an example where the number of the positioning pins 6 is two, but the number of the positioning pins 6 may be three or more as a matter of course.

Since the movable section 5 having a movable range within the horizontal plane to the main body 8 of the suction head and the plate having the positioning pins 6 disposed thereto are integrally configured, when the movable section 5 moves to the main body 8, the positioning pins 6 can move in corporation therewith.

Furthermore, a second air cylinder 11 that moves the movable section 5 and the positioning pins 6, which are integrally configured, in a movable range of the slide bearing 9 toward a base direction of the arm 3 is arranged on the main body 8 of the suction head. Moreover, on a distal end side of the suction head 2, the main body 8 of the suction head 2 and the movable section 5 are connected through springs 12 which are in a stretched state (a state where the springs 12 have contracting force toward the distal end direction of the arm 3) so that the movable section 5 can be corrected and held in the distal end direction of the arm 3 within the movable region of the movable section 5. In a state where the second air cylinder 11 is stretched, since the movable section 5 comes into contact with the distal end of the second air cylinder 11 and pulled in the distal end direction of the arm 3 by the springs 12, the movable section 5 is fixed to the main body 8 of the suction head. Furthermore, in a state where the second air cylinder 11 is not stretched, i.e., a state where the movable section 5 is not fixed by the second air cylinder 11, the movable section 5 can move within the range of the slide bearing 9.

Here, an arm using an articulated robot may be adopted in place of the turnable arm 3. In this case, a stretching/contracting function of the arm 3, i.e., a first air cylinder 7 may be eliminated. Moreover, the second air cylinder 11 which pushes out the movable section 5 toward the base side of the arm may be substituted by a cylinder having a mechanism using a motor or a magnet. Alternatively, it is possible to adopt a mechanism using a compliance unit which can move the movable section 5 toward the base side at the time of fixing the movable section 5.

The workpiece loading operation will now be described.

Figure 6:
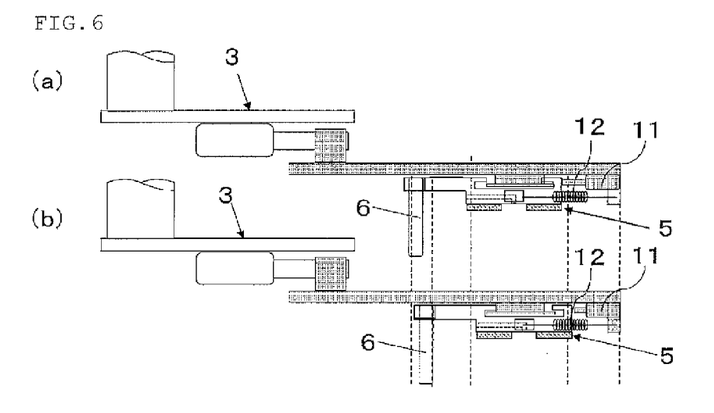
FIG. 6(a) is a side elevation showing an example of a state where a second air cylinder of the suction head is stretched in the automatic handling apparatus according to the present invention.
FIG. 6(b) is a side elevation showing an example of a state where the second air cylinder of the suction head is contracted in the automatic handling apparatus according to the present invention.

As described above, in such a double-side machining apparatus 20 as shown in FIG. 1, the carrier 23 is first set in a standby mode at a workpiece loading position by controlling stop positions of the sun gear 21 and the internal gear 22. Then, the arm 3 is turned to allow the workpiece W sucked by the suction head 2 to approach the upper side of this carrier 23. Subsequently, as shown in FIG. 6(a), the second air cylinder 11 is stretched, the movable section 5 is fixed, and then the movable section 5 holding the workpiece W is lowered to a position at which the workpiece W is slightly high from a surface of the carrier 23. At this time, the plurality of positioning pins 6 are disposed at positions where they do not come into contact with all of the lower turntable 25, the carrier 23, and the internal gear 22 in FIG. 1, and inserted into gaps between them respectively.

Then, as shown in FIG. 6(b), the movable section 5 and the positioning pins 6 are released from a state where they are being pushed toward the base of the arm 3 by contracting the second air cylinder 11 and pulled by the springs 12 to relatively move in an arm distal end direction, i.e., the sun gear 21 direction in FIG. 1, and the gaps between the positions pins 6 and the carrier 23 are decreased or these member start to come into contact with each other. When the positioning pins 6 and the carrier 23 start to come into contact with each other, the carrier 23 is pushed toward the sun gear 21 side by the positioning pins 6, and a clearance between the carrier 23 and the sun gear 21 side is reduced or becomes zero.

Figure 7:
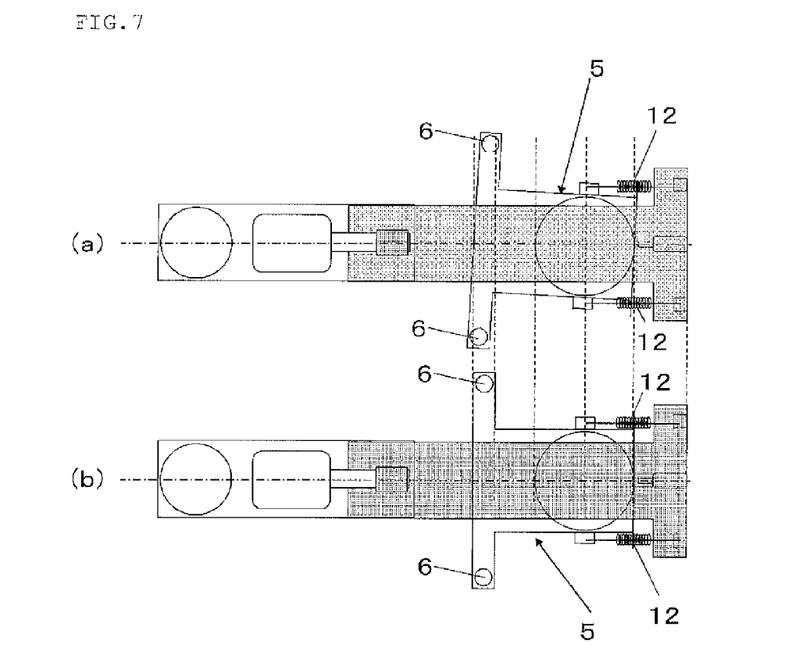
FIG. 7(a) is a top view showing an example of a state where the movable section of the suction head has moved within a horizontal plane in the automatic handling apparatus according to the present invention.
FIG. 7(b) is a top view showing an example of a state where the movable section of the suction head is not moving in the automatic handling apparatus according to the present invention.

Furthermore, pulling is further performed by force of the springs 12, and the movable section 5 and the positioning pins 6 move from a state shown in FIG. 7(b) while inclining toward the sun gear side as shown in FIG. 7(a). Here, since the main body 8 of the suction head and the movable section 5 are connected to each other through the slide bearing 9, even if the carrier 23 is placed at a position having an inclination in the θ direction, the movable section 5 moves while inclining so that the plurality of positioning pins 6 are appressed against the tooth bottoms of the outer peripheral gear of the carrier 23. At this time, the carrier 23 is pushed toward the sun gear 21 side by the further contracting force of the springs 12, and the clearance between the carrier 23 and the sun gear 21 becomes zero. That is, the position and the direction of the carrier 23 are fixed by the sun gear 21 and the plurality of positioning pins 6.

In this state, the arm 3 and the suction head 2 are moved down until the workpiece W is placed in the workpiece holding hole 24, and the suction and the holding are released, thereby accurately loading the workpiece W into the workpiece holding hole 24. Then, the suction head 2 which has released the suction and the holding of the workpiece slightly moves up, then stretches the second air cylinder 11, moves the movable section 5 toward the base of the arm 3, releases the contact state of the positioning pins 6 and the carrier 23, produces a clearance, then further moves up, and moves to the stage 4 to suck and hold a subsequent workpiece to be carried. The double-side machining apparatus 20 performs 72° indexing to the carrier 23 to prepare for loading of the next workpiece. The workpieces can be loaded into all the five carriers by repeating these operations for five times.

A configuration of the stage 4 and a workpiece sucking operation on the stage will now be described.

The stage 4 in the automatic handling apparatus according to the present invention may have a mechanism which can mount the workpiece W to be sucked and carried into the workpiece holding hole 24 of the carrier by the suction head 2 at a position where the center of the workpiece W held by the movable section 5 coincides with the center of the workpiece holding hole 24 at the time of the plurality of positioning pins 6 fixing the position and the direction of the carrier 23.

Specifically, it is preferable for the stage 4 to comprise a plurality of positioning holes into which the plurality of positioning pins 6 are inserted when the movable section 5 sucks and holds the workpiece W mounted on the stage 4, and a position of plurality of positioning holes is adjusted so that the movable section 5 is allowed to hold the workpiece W at a position where the center of the workpiece W held by the movable section 5 coincides with the center of the workpiece holding hole 24 at the time fixing the position and the direction of the carrier 23 by the plurality of positioning pins 6 inserted into the plurality of positioning holes.

An example of the configuration of such a stage will now be described with reference to FIG. 8.

Figure 8:
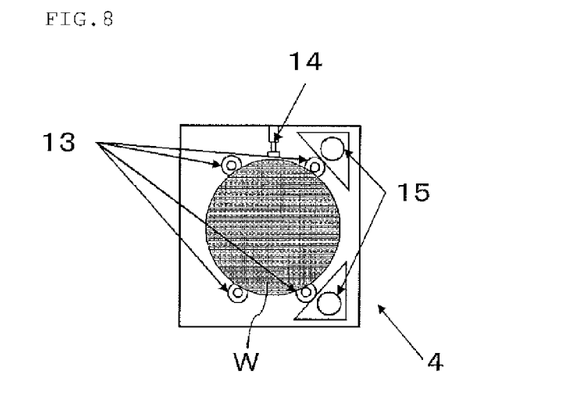
FIG. 8 is a top view showing an example of a configuration of a stage in the automatic handling apparatus according to the present invention.

As shown in FIG. 8, a centering mechanism for workpieces is provided to the stage on which each workpiece to be carried into the workpiece holding hole 24 is provided, and a position of the workpiece W manually or automatically placed on this mechanism can always remain the same. In the stage 4 shown in FIG. 8, the workpiece placed on a plurality of workpiece support sections 13 is pushed in one direction by a pusher 14 constituted of, e.g., an air cylinder, and the workpiece W is fixed by the pusher 14 and the workpiece support sections 13 on the other side which hold the workpiece, thereby always obtaining the same position of the workpiece W.

Furthermore, in this stage 4, a plurality of positioning holes 15 into which the plurality of positioning pins 6 of the suction head 2 are inserted are provided. Each of these positioning holes 15 has a larger diameter than that of each positioning pin 6 so that each positioning pin 6 can be inserted when the suction head 2 moves down irrespective of a stretching/contracting position of the second air cylinder 11 shown in FIGS. 6(a) and (b). Moreover, the positioning holes 15 are set at positions where the plurality of positioning pins 6 come into contact with inner walls of the plurality of positioning holes 15 when the second air cylinder 11 is contracted and the movable section 5 is pulled in the distal end direction of the arm 3 by the springs 12.

Additionally, in a case where the movable section 5 sucks the workpiece W in this state, the positions of the positioning holes 15 are adjusted so that the center of the workpiece W coincides with the center of the workpiece holding hole 24 when the positioning pins 6 come into contact with the carrier 23 in the workpiece loading operation.

The suction head 2 which has turned moves down onto this stage 4 in a state where the second air cylinder 11 is stretched. The downward movement is stopped when a suction surface of the suction head 2 reaches a position slightly above the surface of the workpiece W, and the second air cylinder 11 is contracted. The movable section 5 released from the second air cylinder 11 is pulled in the distal end direction of the arm 3 by the force of the springs 12, and the plurality of positioning pins 6 perfectly comes into contact with the inner walls of the positioning holes 15. Further, the workpiece W is sucked, held, and moved up, and then it is turned to the workpiece loading position. The workpiece W is loaded into the workpiece holding hole 24 of the carrier 23 by the above-mentioned workpiece loading operation.

As described above, according to the automatic handling apparatus including the stage having the positioning holes corresponding to the positioning pins of the suction head, the simple configuration of the stage enables holding the workpiece at the position where the center of the workpiece held by the movable section coincides with the center of the workpiece holding hole, and the workpiece can be more easily and accurately loaded.

A description will now be given as to an unloading operation of unloading and carrying the workpiece W held in the workpiece holding hole 24 of the carrier 23 after end of machining using the double-side machining apparatus 20.

First, the carrier 23 holding the workpiece W is set in the standby mode at the workpiece loading position like the loading operation. Then the suction head 2 is introduced to the upper side of this workpiece W by turning the arm 3. At this time, the first air cylinder 7 can be set in the contracted state.

Figure 9:
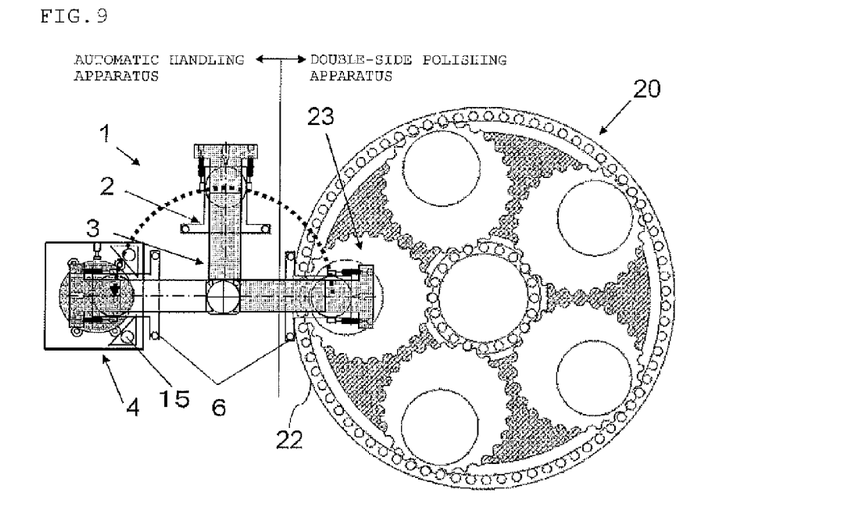
FIG. 9 is a view for explaining a workpiece unloading operation using the automatic handling apparatus according to the present invention.

Here, when the first air cylinder 7 is in the contracted state, the suction head 2 is placed on the internal gear 22 side as compared with the loading operation, but it is still placed above the workpiece W. In this state, since the movable section 5 of the suction head 2 is just being pulled by the springs 12, the second air cylinder 11 is stretched, and the movable section 5 is fixed. At this time, as shown in FIG. 9, the positioning pins 6 used in the loading operation are placed outside the internal gear 22.

Then, the suction head 2 moves down to a position at which the suction pad 10 comes into contact with the workpiece W, and sucks and holds the workpiece W. Since the positioning pins 6 are placed outside the internal gear 22, the suction head 2 can move down without coming into contact with the internal gear 22 or the carrier 23. Subsequently, the suction head 2 which is sucking the workpiece moves up, turns to automatic handling apparatus side, puts the workpiece W on the stage 4, and then releases the workpiece. At this time, as shown in FIG. 9, since the arm operates in the contracted state, when the arm 3 moves down in order to put the workpiece W on the stage 4, the positioning pins 6 can be moved down to the outer side of the positioning holes 15 of the stage 4. Subsequently, the arm 3 and the suction head 2 are moved up to perform indexing of the carrier 23, and moved to the unloading position of a subsequent workpiece W. Unloading of all the workpieces W is finished by repeating these operations for five times.

EXAMPLE

Although the present invention will now be more specifically described hereinafter with reference to an example of the present invention, the present invention is not restricted thereto.

Example 1

Carrying a silicon wafer into the workpiece holding hole of the carrier in the double-side polishing apparatus 20 and carrying out the silicon wafer from the workpiece holding hole after double-side polishing were repeatedly performed in accordance with the above-mentioned loading operation and unloading operation of the workpiece by using such an automatic handling apparatus 1 according to the present invention as shown in FIG. 1, and a total of 3000 silicon wafers each having a diameter of 300 mm were carried in and out.

At this time, the stage having the positioning holes was used, the positioning holes being adjusted so that the movable section of the suction head can hold the workpiece at a position where the center of the silicon wafer held by the movable section coincides with the center of the workpiece holding hole.

Consequently, each of all the 3000 silicon wafers could be correctly loaded into the workpiece holding hole of the carrier, and the number of error which has occurred in unloading of each silicon wafer after the double-side polishing was zero.

As described above, it was confirmed that the automatic handling apparatus of the present invention enables accurately carrying in or out the workpiece at low costs without using an expensive device.

It is to be noted that the present invention is not restricted to the foregoing embodiment. The foregoing embodiment is an illustrative example, and any example which has substantially the same configuration and exerts the same functions and effects as those of the technical concept described in claims of the present invention is included in the technical scope of the present invention.

The invention claimed is:

1. An automatic handling apparatus which carries a workpiece into a workpiece holding hole of a carrier for holding the workpiece or carries the workpiece out of the workpiece holding hole of the carrier in a workpiece double-side machining apparatus having the carrier which engages with a sun gear and an internal gear and performs a planetary gear motion, comprising:

a suction head which sucks and holds the workpiece; an arm which is connected to the suction head and moves the suction head; and a stage on which the workpiece to be carried to the workpiece holding hole of the carrier is mounted, wherein the suction head comprises a movable section which is movable within a parallel plane to a main body of the suction head, the movable section is configured to suck and hold the workpiece, and comprises a plurality of positioning pins stretched in a vertically lower direction, and at the time of loading the workpiece held by the movable section into the workpiece holding hole of the carrier, the plurality of positioning pins are appressed against spur gear troughs of a gear on an outer periphery of the carrier and the movable section moves within the parallel plane, thereby the carrier is pushed against the sun gear side to fix a position and a direction of the carrier, and the held workpiece is carried into the carrier holding hole.

2. The automatic handling apparatus according to claim 1, wherein the stage comprises a centering mechanism configured to mount the workpiece at a position where a center of the workpiece held by the movable section coincides with a center of the workpiece holding hole of the carrier at the time of fixing the position and the direction of the carrier by the plurality of positioning pins.

3. The automatic handling apparatus according to claim 2, wherein the stage comprises a plurality of positioning holes into which the plurality of positioning pins are inserted when the movable section sucks and holds the workpiece mounted on the stage, and a position of the plurality of positioning holes is adjusted so that the movable section is configured to hold the workpiece at a position where the center of the workpiece held by the movable section coincides with the center of the workpiece holding hole at the time fixing the position and the direction of the carrier by the plurality of positioning pins inserted into the plurality of positioning holes.

* * * * *